(12) United States Patent
Gao et al.

(10) Patent No.: US 11,573,348 B1
(45) Date of Patent: Feb. 7, 2023

(54) METHOD AND SYSTEM USING NUCLEAR MAGNETIC RESONANCE WELL LOGGING FOR $T_2$ CUTOFF VALUE ESTIMATION

(71) Applicant: SAUDI ARABIAN OIL COMPANY, Dhahran (SA)

(72) Inventors: Jun Gao, Dhahran (SA); Hyung T. Kwak, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 0 days.

(21) Appl. No.: 17/585,354

(22) Filed: Jan. 26, 2022

(51) Int. Cl.
  *G01V 3/32* (2006.01)
  *G01V 3/38* (2006.01)
  *G01R 33/44* (2006.01)
  *G01N 24/08* (2006.01)

(52) U.S. Cl.
  CPC ............ *G01V 3/32* (2013.01); *G01N 24/081* (2013.01); *G01R 33/448* (2013.01); *G01V 3/38* (2013.01)

(58) Field of Classification Search
  CPC ...... G01N 24/081; G01R 33/448; G01V 3/32; G01V 3/38
  See application file for complete search history.

(56) References Cited

U.S. PATENT DOCUMENTS

| | | | |
|---|---|---|---|
| 6,859,034 B2 | 2/2005 | Chen | |
| 2014/0035574 A1* | 2/2014 | Sun | G01V 3/14 324/303 |

(Continued)

FOREIGN PATENT DOCUMENTS

| | | |
|---|---|---|
| EP | 1259836 B1 | 4/2006 |
| EP | 1852718 A2 | 11/2007 |

(Continued)

OTHER PUBLICATIONS

Coates, G. R. et al., "The MRIL in Conoco 33-1: An Investigation of a New Magnetic Resonance Imaging Log", SPWLA 32nd Annual Logging Symposium, Midland, Texas, USA, 1991 (24 pages).

(Continued)

*Primary Examiner* — Gregory H Curran
(74) *Attorney, Agent, or Firm* — Osha Bergman Watanabe & Burton LLP

(57) ABSTRACT

A nuclear magnetic resonance (NMR) logging system and method is disclosed. The method may include obtaining an NMR well log, a measured downhole temperature, and at least one rock sample for a formation in a subsurface region. The method may further include determining an NMR distribution for each sample and selecting a set of samples based on the determined NMR distribution. For each selected sample, the method may further include determining a first parameter of the NMR distribution, a regression parameter of a relationship, and a first and second fractal parameters of the NMR distribution. The method may further include determining a second parameter of the NMR distribution based on the first and second fractal parameters, the regression parameter, and the downhole temperature. The method may still further include determining a parameter of the formation based on the second parameter of the NMR distributions of the set of samples.

20 Claims, 7 Drawing Sheets

(56) References Cited

U.S. PATENT DOCUMENTS

| | | | |
|---|---|---|---|
| 2015/0219782 A1* | 8/2015 | Kadayam Viswanathan | G01V 3/38 324/309 |
| 2016/0061986 A1* | 3/2016 | Anand | G01V 3/32 324/303 |

FOREIGN PATENT DOCUMENTS

| | | |
|---|---|---|
| EP | 2999957 A1 | 3/2016 |
| EP | 3397838 A1 | 11/2018 |

OTHER PUBLICATIONS

Ge, X. et al., "Determination of nuclear magnetic resonance T2 cutoff value based on multifractal theory—An application in sandstone with complex pore structure", Geophysics, vol. 80, No. 1, D11-D21, 2015 (15 pages).

Godefroy, S. et al., "Temperature Effect on NMR Surface Relaxation in Rocks for Well Logging Applications", J. Phys. Chem., B, 106, p. 11183-11190, 2002 (8 pages).

Hu, Y. et al., "A method to determine nuclear magnetic resonance T2 cutoff value of tight sandstone reservoir based on multifractal analysis", Energy Science & Engineering, 8(4), pp. 1135-1148, 2020 (14 pages).

Latour L L. et al., "Nuclear Magnetic Resonance Properties of Rocks at Elevated Temperature", Journal of Colloid and Interface Science, vol. 150, No. 2, pp. 535-548, 1992 (14 pages).

Zhang, Z. et al., "Fractal dimension of pore-space geometry of an Eocene sandstone formation", Geophysics, vol. 79, No. 6, D377-D387, 2014 (11 pages).

Tzanis, Chris G. et al., "Multifractal Detrended Cross-Correlation Analysis of Global Methane and Temperature", Remote Sensing, 12, 557, 2020 (13 pages).

Parra, J.O. et al., "NMR and Acoustic Signatures in Vuggy Carbonate Aquifers", SPWLA 42nd Annual Logging Symposium, 2001 (11 pages).

\* cited by examiner

US 11,573,348 B1

METHOD AND SYSTEM USING NUCLEAR MAGNETIC RESONANCE WELL LOGGING FOR $T_2$ CUTOFF VALUE ESTIMATION

BACKGROUND

The characterization of subsurface petrophysical properties is useful for reserve assessment and production optimization. These subsurface properties may be integrated with multiphysics core measurements across different plug scale and log scales to provide constraints on reservoir model building. Core samples may be analyzed through various sensors or probes, such as through core scans performed using a nuclear magnetic resonance (NMR) to measure numerous formation and fluid properties, such as porosity, formation permeability, irreducible saturation, hydrocarbon typing, and viscosity. The cutoff value of NMR transverse relaxation time ($T_2$) provides useful information for pore structure characterization, permeability prediction, and irreducible water saturation calculation.

However, conventional methods often predict inaccurate NMR $T_2$ cutoff values for a rock sample with complex pore structure. In order to achieve better prediction for petrophysical properties for reservoir model building, it is necessary to predict an accurate NMR $T_2$ cutoff value for the rock sample of formation of interest.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, in one aspect, embodiments relate to a nuclear magnetic resonance (NMR) logging method that includes obtaining an NMR well log, a measured downhole temperature for a formation in a subsurface region, and obtaining at least one rock sample of the formation from the subsurface region. The method further includes determining an NMR distribution for each rock sample at multiple temperatures and selecting a set of rock samples based on the NMR distribution of the rock samples. For each selected rock sample, the method includes determining a first parameter of the NMR distribution at each of a plurality of laboratory measured temperatures, a regression parameter of a relationship between the first parameter of the NMR distribution and laboratory measured temperatures, a first fractal parameter and a second fractal parameter of the NMR distribution. The method still further includes determining a second parameter of the NMR distribution based, at least in part, on the first fractal parameter, the second fractal parameter, the regression parameter, and the downhole temperature measurement, and determining a parameter of the formation based, at least in part, on the second parameter of the NMR distributions of the set of rock samples.

In general, in one aspect, embodiments relate to a system that includes a logging system coupled to a logging tool. The system further includes a well system coupled to the logging system and a wellbore. The system further includes a reservoir simulator module including a computer processor. The reservoir simulator module is coupled to the logging system and the well system. The reservoir simulator module obtains an NMR well log and a measured downhole temperature for a formation in a subsurface region. The reservoir simulator module obtains at least one rock sample of the formation from the subsurface region. The reservoir simulator module determines an NMR distribution for each rock sample at a plurality of temperatures. The reservoir simulator module selects a set of rock samples based on the NMR distribution of the rock sample. For each selected rock sample, the reservoir simulator module determines a first parameter of the NMR distribution at each of a plurality of laboratory measured temperatures, a regression parameter of a relationship between the first parameter of the NMR distribution and laboratory measured temperatures, a first fractal parameter and a second fractal parameter of the NMR distribution. the reservoir simulator module determines a second parameter of the NMR distribution based, at least in part, on the first fractal parameter, the second fractal parameter, the regression parameter, and the downhole temperature measurement. the reservoir simulator module determines a parameter of the formation based, at least in part, on the second parameter of the NMR distributions of the set of rock samples.

In general, in one aspect, embodiments relate to a non-transitory computer readable medium storing instructions executable by a computer processor. The instructions include obtaining an NMR well log, a measured downhole temperature for a formation in a subsurface region, and at least one rock sample of the formation from the subsurface region. The instructions further include determining an NMR distribution for each rock sample at a plurality of temperatures and selecting a set of rock samples based on the NMR distribution of the rock sample. For each selected rock sample, the instructions include determining a first parameter of the NMR distribution at each of a plurality of laboratory measured temperatures, a regression parameter of a relationship between the first parameter of the NMR distribution and laboratory measured temperatures, a first fractal parameter and a second fractal parameter of the NMR distribution. The instructions still further include determining a second parameter of the NMR distribution based, at least in part, on the first fractal parameter, the second fractal parameter, the regression parameter, and the downhole temperature measurement, and determining a parameter of the formation based, at least in part, on the second parameter of the NMR distributions of the set of rock samples.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

DETAILED DESCRIPTION

Figure 1:
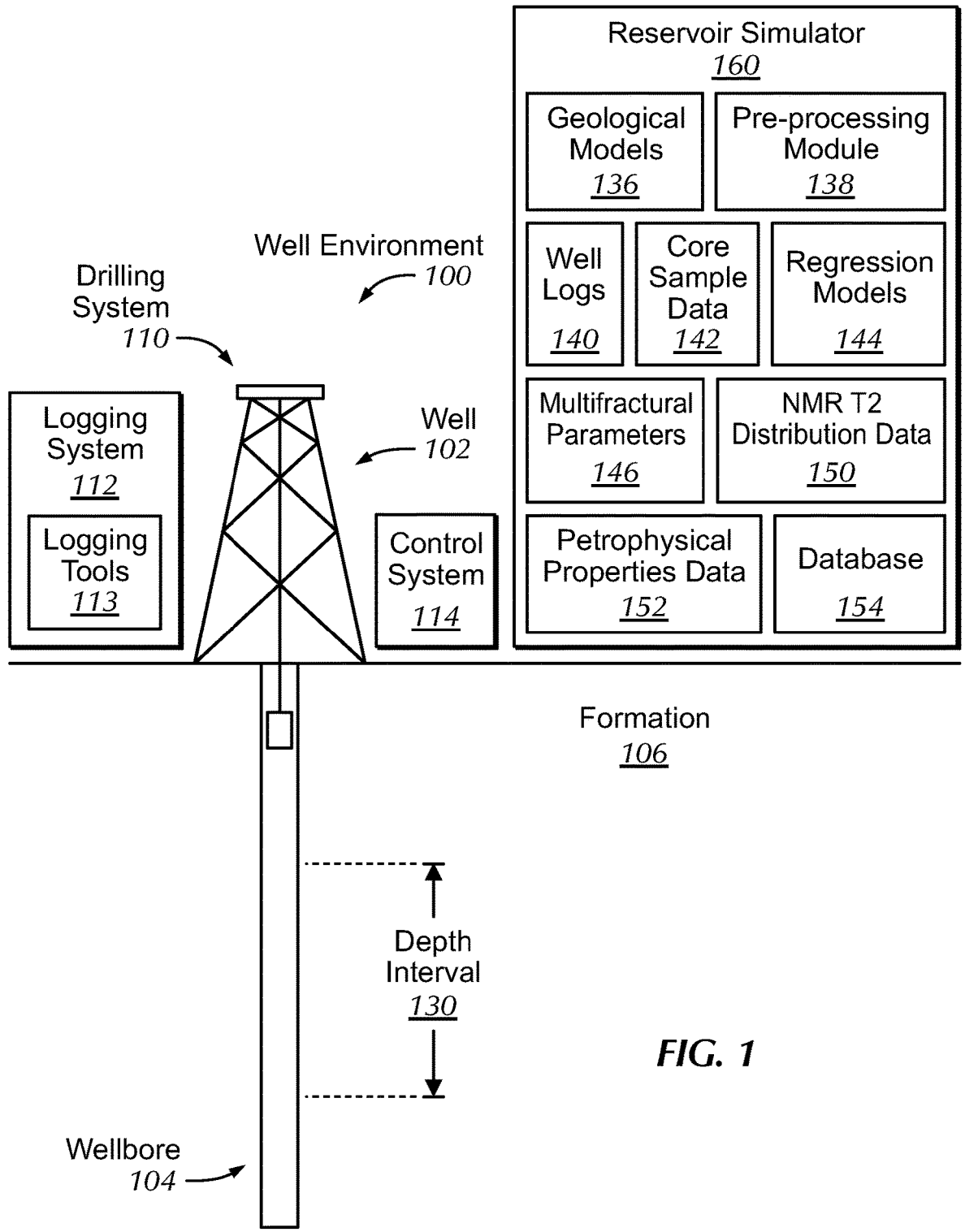
FIG. 1 shows a system in accordance with one or more embodiments.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the disclosure include systems and methods for performing a nuclear magnetic resonance (NMR) logging method for predicting a temperature correct NMR $T_2$ cutoff value ($T_{2c}$) using a multifractal dimension analysis and a temperature correction function. The NMR logging method is applied to determine one or more petrological properties (e.g., permeability and irreducible saturation) at a formation temperature for a rock sample of a formation. For example, the NMR logging method generates a high quality formation petrophyscial property model for reserve assessment and production optimization by accurately calibrating an NMR response to a tight rock sample which includes various mineral compositions, different depositional and diagenetic histories, and different formation conditions. As another example, the NMR logging method determines a temperature correct NMR $T_{2c}$ value at a formation temperature measured by a downhole temperature tool or a temperature log for permeability and irreducible saturation estimation based on a multifractal dimension analysis of NMR $T_2$ distribution, a temperature correction, and a free-fluid (e.g., Timur-Coates) model.

In some example embodiments, the NMR logging method based on the multifractal dimension analysis and the temperature correction may be performed in a specialized testing apparatus in the lab. In other example embodiments, the NMR logging method based on the multifractal dimension analysis and the temperature correction may be performed in a specialized testing apparatus downhole during drilling.

Further, the NMR logging method applies the multifractal dimension analysis to determine a relationship between multifractal parameters, routine properties, and the NMR $T_{2c}$ value based on minimal fractal dimension ($D_{min}$), maximal fractal dimension ($D_{max}$), and flow zone index (FZI). However, there are several difficult problems to obtaining an accurate NMR $T_{2c}$ value at the formation temperature. For example, the NMR $T_{2c}$ measurement may have a low resolution because the pore size distribution from NMR $T_2$ distribution may span more than two orders of magnitude due to irregular microscopic pore space. As such, some embodiments address these problems by applying the multifractal dimension analysis to provide a sufficiently small resolvable NMR $T_2$ value based on a capillary bundle tube model.

The NMR logging method determines one or more calibration parameters (e.g., an NMR $T_{2c}$ value) for the rock sample at a formation temperature using the temperature correction function based on a Gaussian analysis and a linear/nonlinear regression algorithm. The temperature effect may be large difference between a room temperature and a formation temperature. However, there are several difficult problems to obtaining an accurate temperature dependence of NMR $T_{2c}$ value at the formation temperature. For example, the NMR $T_{2c}$ value is defined as the value to distinguish the bound or irreducible fluid and the flow fluid. Further, the NMR $T_{2c}$ value may depend on multiple factors (e.g., bulk relaxation, fluids, diffusion, pore size, etc.). In particular, the NMR $T_{2c}$ value may be determined by using poor quality multifractal parameters due to the effect of diffusion coupling on the shape distribution curve of the NMR $T_2$ distribution. As such, some embodiments address these problems by applying a Gaussian fitting to measure temperature dependence of an overall shift of the NMR $T_2$ distribution. In particular, the NMR logging method evaluates the temperature correction by applying a linear/nonlinear regression fitting to the NMR $T_2$ logarithmic ($T_2$lm) mean difference as a function of temperature for a rock sample whose NMR $T_2$ distribution doesn't indicate significant diffusion coupling. Thus, the NMR logging method applies a temperature correction based on the effect of surface property and pore size of the rock sample.

Turning to FIG. 1, FIG. 1 shows a schematic diagram in accordance with one or more embodiments. FIG. 1 illustrates a well environment (100) that may include a well (102) having a wellbore (104) extending into a formation (106). The wellbore (104) may include a bored hole that extends from the surface into a target zone of the formation (106), such as a reservoir. The formation (106) may include various formation characteristics of interest, such as formation porosity, formation permeability, water saturation, irreducible water saturation, rock type, temperature, density and the like. Porosity may indicate how much space exists in a particular rock within an area of interest in the formation (106), where oil, gas, and/or water may be trapped. Permeability may indicate the ability of liquids and gases to flow through the rock within the area of interest. Water saturation may indicate the fraction of water in a given pore space. Irreducible water saturation may indicate the ratio of irreducible total fluid volume to effective porosity for a formation (106) within the area of interest. Rock type may indicate the type of rock for a formation (106) with the area of interest. For example, a tight chalk may have a high strength property that requires a high pump pressure for breaking the chalk. Temperature may indicate the temperature or the temperature gradient for a formation (106) with the area of interest. Density may indicate the bulk density for a formation (106) with the area of interest.

The well environment (100) may include a drilling system (110), a logging system (112), a control system (114), and a reservoir simulator (160). The drilling system (110) may include a drill string, a drill bit, a mud circulation system and/or the like for use in boring the wellbore (104) into the formation (106). The control system (114) may include hardware and/or software for managing drilling operations and/or maintenance operations. For example, the control system (114) may include one or more programmable logic controllers (PLCs) that include hardware and/or software with functionality to control one or more processes performed by the drilling system (110). Specifically, a PLC may control valve states, fluid levels, pipe pressures, warning alarms, drilling parameters (e.g., torque, WOB, SPP, RPM, etc.) and/or pressure releases throughout a drilling rig. In particular, a PLC may be a ruggedized computer system with functionality to withstand vibrations, extreme temperatures, wet conditions, and/or dusty conditions, for example, around a drilling rig. Without loss of generality, the term "control system" may refer to a drilling operation control system that is used to operate and control the equipment, a drilling data acquisition and monitoring system that is used to acquire drilling process and equipment data and to monitor the operation of the drilling process, or a drilling interpretation software system that is used to analyze and understand drilling events and progress.

The logging system (112) may include one or more logging tools (113) (e.g., a NMR spectrometer) for use in generating well logs (140), core sample data (142) and NMR $T_2$ distribution data (150) of the formation (106). The logging tools (113) provide a powerful way to characterize the fine scale petrophysical properties data (152) (e.g., density, porosity, permeability, rock type, water saturation, irreducible water saturation, etc.).

Furthermore, as another example, the NMR logging tool may measure the induced magnetic moment of hydrogen nuclei (e.g., protons) contained within the fluid-filled pore space of porous media (e.g., reservoir rocks). Thus, NMR logs may measure the magnetic response of fluids present in the pore spaces of the reservoir rocks. In particular, NMR logs may measure the magnetic response of fluids at the pore spaces of the reservoir rocks are fully saturated with water. Likewise, NMR logs may measure the magnetic response of fluids at the pore spaces of the reservoir rocks only contain irreducible water after the fluid above a corresponding pore radius is removed from the reservoir rocks by adjusting a centrifugal force in a high-speed centrifuge. In so doing, NMR logs may measure porosity (e.g., incremental porosity, cumulative porosity, total porosity, irreducible porosity, and movable porosity, etc.) and permeability, as well as the types of fluids present in the pore spaces. Thus, NMR logging may be a subcategory of electromagnetic logging that responds to the presence of hydrogen protons rather than a rock matrix. Because hydrogen protons may occur primarily in pore fluids, NMR logging may directly or indirectly measure the volume, composition, viscosity, and distribution of pore fluids.

A logging tool (113) may be lowered into the wellbore (104) and/or in the laboratory to acquire measurements (e.g., well logs (140), core sample data (142), and NMR $T_2$ distribution data (150)) as the tool traverses a depth interval (130) (e.g., a targeted reservoir section) of the wellbore (104). The plot of the logging measurements versus depth may be referred to as a "log" or "well log". Well logs (140) may provide depth measurements of the well (102) that describe such reservoir characteristics as formation porosity, formation permeability, resistivity, density, water saturation, total organic content (TOC), volume of kerogen, Young's modulus, Poisson's ratio, and the like. The resulting logging measurements may be stored and/or processed, for example, by the control system (114), to generate corresponding well logs (140) for the well (102). A well log may include, for example, a plot of a logging response time versus true vertical depth (TVD) across the depth interval (130) of the wellbore (104).

Reservoir characteristics may be determined using a variety of different techniques. For example, certain reservoir characteristics can be determined via coring (e.g., physical extraction of rock samples) to produce core samples and/or logging operations (e.g., wireline logging, logging-while-drilling (LWD) and measurement-while-drilling (MWD)). Coring operations may include physically extracting a rock sample from a region of interest within the wellbore (104) for detailed laboratory analysis. For example, when drilling an oil or gas well, a coring bit may cut plugs (or "cores" or "core samples") from the formation (106) and bring the plugs to the surface, and these core samples may be analyzed at the surface (e.g., in a lab) to determine various characteristics of the formation (106) at the location where the sample was obtained.

To determine porosity in the formation (106), various types of logging techniques may be used. For example, the logging system (112) may measure the water temperature in the formation (106) for characterizing water bearing zones and identifying vertical flow in the formation (106). This type of logging may generate borehole temperature logs. Likewise, NMR logging may measure NMR $T_2$ distribution to provide information about the fluid distribution, pore structure, and pore volume change to obtain important reservoir evaluation parameters (e.g., total porosity, effective porosity, permeability, irreducible saturation, and movable water saturation, etc.). In particular, NMR $T_2$ distribution may include three components associated with bulk, surface, and diffusion (Equation 1). When the rock sample is fully water saturated, NMR $T_2$ distribution is dominated by the surface term $T_{2\_Surface}$. Thus, the NMR $T_2$ distribution may be used to characterize pore size distribution of the rock sample (e.g., see the accompanying description to FIG. 2).

$$\frac{1}{T_2} = \frac{1}{T_{2\_Bulk}} + \frac{1}{T_{2\_Surface}} + \frac{1}{T_{2\_Diffusion}} \quad (1)$$

where $T_2$ is transverse relaxation time in ms of pore fluid, $T_{2\_Bulk}$ is bulk transverse relaxation time in ms of pore fluid, $T_{2\_Surface}$ is surface transverse relaxation time in ms of pore fluid, $T_{2\_Diffusion}$ is diffusion transverse relaxation time in ms of pore fluid.

Furthermore, NMR logging may measure an NMR $T_{2C}$ value which is the $T_2$ boundary value between the movable fluid and the irreducible fluid. In particular, different types of rock may affect the transverse relaxation time characteristics of NMR logging. Thus, the NMR $T_2$ value and the NMR $T_{2C}$ value may be used to distinguish the rock type and other petrophysical properties for a formation of interest. For example, carbonate pores usually have an NMR $T_2$ distribution ranging from 0.01 to 1000 milliseconds (ms), and shale pores usually have an NMR $T_2$ distribution ranging from 0.01 to 10 ms. As another example, the medium-hand high-permeability sandstone reservoirs have an average NMR $T_{2C}$ value of 30.0 ms, and shale reservoirs have an average NMR $T_{2C}$ value of 8.3 ms.

Further, geosteering may be used to position the drill bit or drill string of the drilling system (110) relative to a boundary between different subsurface layers (e.g., overlying, underlying, and lateral layers of a pay zone) during drilling operations. In particular, measuring rock properties during drilling may provide the drilling system (110) with the ability to steer the drill bit in the direction of desired hydrocarbon concentrations. As such, a geosteering system may use various sensors located inside or adjacent to the drilling string to determine different rock formations within a well path. In some geosteering systems, drilling tools may use resistivity or acoustic measurements to guide the drill bit during horizontal or lateral drilling.

Continuing with FIG. 1, the reservoir simulator (160) includes hardware and/or software with functionality to pre-process NMR $T_2$ distribution data (150) (e.g., a pre-processing module (138)) to detect a rock sample which NMR $T_2$ distribution shows significant diffusion coupling based on the well logs (140). A diffusion coupling effect usually occurs in a rock sample in which fluids between pore throats (240) with different radii are interconnected by diffusion. Thus, the diffusion coupling effect may make it difficult to distinguish the NMR $T_2$ distribution of meso pores and micro pores' throats in the same rock sample.

The pre-processing module (138) determines an NMR $T_{2C}$ value from NMR $T_2$ distribution data (150) for a targeted formation (106) of interest based on actual well logs (140). The determined NMR $T_{2C}$ value may be saved in a database (154). For example, the NMR $T_{2C}$ value may be used to determine free fluid index (FFI) and bulk volume of irreducible water saturation (BVI) for permeability and free fluid determination for the rock sample. For another example, the pre-processing module (138) applies a log-normal distribution (Equation 13) and a Gaussian fitting curve (Equation 2) to match meso pore NMR $T_2$ distribution data (150) to identify a diffusion coupling effect for the rock sample. In particular, the rock sample shows a significant diffusion coupling when meso and micro peaks of NMR $T_2$ distribution data (150) converge to the same peak (for example, see the accompanying description of FIG. 3).

$$f(t) = Ae^{-\frac{(t-\mu)^2}{2\sigma^2}} \quad (2)$$

where A is the amplitude, $\mu$ is the position, t is the time in the logarithmic scale, and $\sigma$ is the width.

In one or more embodiments, the reservoir simulator (160) includes hardware and/or software with functionality to determine one or more multifractal parameters (e.g., $D_{min}$ and $D_{max}$) based on the multifractal dimension analysis and the moment method. One important influencing factor of the rock properties is irregular microscopic pore spaces which follow a self-similarity rule. Thus, the rock pore structure may be decomposed into intertwined fractal sets. Self-similarity means that a structure, or a process, and a part of it appear to be the same when compared. For example, fractals (e.g., patterns that form of smaller objects that look the same when magnified) is a well-known example of self-similarity and scale invariance. A self-similar system may be associated with an underlying force that produce the self-similar system is the same at all scales, which results in the smaller parts and the larger parts looking like the whole. Thus, measurements of the methods of different resolving power show scaling properties of fractals based on the theory of fractals. A fractal structure may be described by the basic-power law relationship (Equation 3) in which the frequency N of an occurrence of a given size $\delta$ is inversely proportional to a fractal dimension D of its size.

$$N = \frac{C}{\delta^D} \quad (3)$$

where D is the fractal dimension, N is the number of the elements, $\delta$ is length scale, and C is a constant.

Further, the reservoir simulator (160) may determine one or more fractal dimensions $D_{NMR}$ (e.g., $D_{min}$ and $D_{max}$) based NMR $T_2$ distribution data (150), cumulative volume fraction of wetting fluid $V_c$, and maximum of resolvable relaxation time $T_{2max}$. In particular, for a capillary bundle tube model, if the minimum of resolvable relaxation time $T_{2min}$ is sufficiently small, there is a linear relationship between $\log V_c$ and $\log T_2$ (Equation 4). The fractal dimensions $D_{min}$ and $D_{max}$ may be determined from a slope of the fitting curve of the double logarithmic presentation for the rock sample. For example, the fractal dimensions $D_{min}$ is associated with the largest slope of the fitting curve at a small NMR $T_2$ value for a small pore size. As another example, the fractal dimensions $D_{max}$ is associated with the smallest slope of the fitting curve at a large NMR $T_2$ value for a large pore size. Furthermore, the reservoir simulator (160) may apply the moment method and a dyadic scaling-down to analyze multifractal spectrum $f(\alpha)$ of the probability function $p(\delta)$, mass exponents $\tau(q)$, singularity spectrum $\alpha(q)$, and generalized dimension D (q) based on the pore size distribution on an interval (Equations 5, 6, 7, and 8).

$$\log(V_c) = (3 - D)\log(T_2) - (3 - D)\log T_{2max} \quad (4)$$

$$\tau(q) = -\lim_{\delta \to 0} \frac{\sum_{i=1}^{N(\delta)} p_i^q(\delta)}{\log \delta} \quad (5)$$

$$D(q) = \frac{\tau(q)}{1-q} \quad (6)$$

$$a(q) = \frac{d\tau(q)}{dq} \quad (7)$$

$$f(a) = qa(q) - \tau(q) \quad (8)$$

where $V_c$ is cumulative volume fraction of wetting fluid, D is fractal dimension, $T_2$ is transverse relaxation time, $T_{2max}$ is the maximum of resolvable transverse relaxation time, q is the moment order, $\tau(q)$ is the mass exponents, D (q) is generalized dimension, N is the number of the elements, $\delta$ is length scale, p ($\delta$) is the probability function, $\alpha(q)$ is singularity spectrum, and $f(\alpha)$ is multifractal spectrum.

The reservoir simulator (160) also includes hardware and/or software with functionality to train and apply a regression model (144) (e.g., a linear regression model, a non-linear regression model) to predict NMR $T_{2c}$ based on multifractal parameters (146) (e.g., $D_{min}$ and $D_{max}$) and other petrophysical properties (e.g., FZI) determined using the multifractal dimension analysis for the rock sample of the formation (106). For example, the reservoir simulator (160) may apply a linear regression model to determine a model to calculate NMR $T_{2C}$ based on multifractal parameters $D_{min}$ and $D_{max}$ (Equation 9) and other petrophysical properties (e.g., FZI) (Equations 10 and 11).

$$T_{2c\_room} = a(D_{min} - D_{max}) + b\left(\frac{D_{min}}{D_{max}}\right) + e \quad (9)$$

$$FZI = \left(\frac{1-\phi}{\phi}\right) \times \sqrt{\frac{k}{\phi}} \quad (10)$$

$$T_{2c\_room} = a(D_{min} - D_{max}) + b\left(\frac{D_{min}}{D_{max}}\right) + cFZI \quad (11)$$

where $T_{2c\_room}$ is NMR $T_{2C}$ measured for the fully water saturated rock sample at the room temperature, $D_{min}$ is minimal fractal dimension, $D_{max}$ is maximum fractal dimension, a, b, c, e are coefficients of the linear regression model, FZI is flow zone index, $\phi$ is porosity, and k is permeability.

In one or more embodiments, the reservoir simulator (160) may apply a linear regression model (144) to determine a pore size based temperature correction of NMR $T_2$ distribution data (150) based on the temperature dependence of overall shape shift of NMR $T_2$ distribution (e.g., an NMR $T_2$lM mean difference) for the rock sample of the formation (106) (Equation 13). As the formation temperature is usually larger than the room temperature, the temperature dependence of NMR $T_2$ distribution varies depending on the reservoir rock sample. For example, the temperature dependence of NMR $T_2$ distribution may be weak for some rock samples. As another example, the temperature dependence of NMR $T_2$ distribution may show a significant positive or negative correction for other rock samples. The temperature effect results from many factors (e.g., surface relaxation, bulk relaxation, fluids, and diffusion, pore size, etc.). For example, macro and micro pores show different degrees of temperature dependence of NMR $T_2$ distribution due to potential diffusion coupling and surface properties. In particular, the reservoir simulator (160) may apply a Gaussian fitting curve (Equation 2) to determine the overall shape shift of NMR $T_2$ distribution of meso pores by comparing their NMR $T_2$ lM mean difference at low and high temperatures. Likewise, the reservoir simulator (160) may apply a log-normal distribution (Equations 12 and 13) to calculate NMR $T_2$lm mean difference as a function of temperature difference for meso pores of the rock sample.

$$T_2\text{lm} = \exp\left(\frac{\sum a_i \ln T_i}{\sum a_i}\right) \quad (12)$$

$$\Delta T_2\text{lm}(\%) = d \times (T - T_{room}) \quad (13)$$

Where $T_2$ lM is NMR $T_2$ logarithmic mean value, $T_i$ is ith temperature, $a_1$ is ith incremental porosity, T is a temperature, $T_{room}$ is a room temperature, and d is a coefficient, and $\Delta T2$lm is NMR $T_2$ logarithmic mean difference measured using a Gaussian fitting analysis between a temperature T and the room temperature $T_{room}$.

The reservoir simulator (160) also includes hardware and/or software with functionality to determine a temperature correct NMR $T_{2C}$ value using the temperature correction and the trained model based on multifractal parameters (146) (e.g., $D_{min}$, $D_{max}$), temperature, and other petrophysical properties (e.g., FZI) for the rock sample of the formation (106) (Equation 14). Likewise, the pre-processing module (138) may determine petrophysical properties (e.g., permeability, irreducible saturation) using a free fluid model based on the Timur-Coates equation (Equation 15) for the rock sample of the formation (106).

$$T_{2c\_reservoir} = \quad (14)$$
$$(1 + d \times (T_{reservoir} - T_{room})) \times \left(a(D_{min} - D_{max}) + b\left(\frac{D_{min}}{D_{max}}\right) + cFZI\right)$$

$$k_{Coates} = \left[\left(\frac{\phi}{C}\right)^m \frac{FFI}{BVI}\right]^n \quad (15)$$

where $T_{2c\_reservoir}$ is NMR $T_{2c}$ at a formation temperature for the rock sample, $T_{reservoir}$ is the formation temperature, $T_{room}$ is the room temperature, $D_{min}$ is minimal fractal dimension, $D_{max}$ is maximum fractal dimension, a, b, c, d are coefficients of the linear regression model, FZI is flow zone index, $\phi$ is porosity, C, m, n are coefficients, BVI is bulk volume irreducible, and FFI is free fluid index.

Keeping with FIG. 1, a well path of a wellbore (104) may be updated by the control system (114) using a geological model (e.g., one of the geological models (136)). For example, a control system (114) may communicate geosteering commands to the drilling system (110) based on well data updates that are further adjusted by the reservoir simulator (160) using a geological model (136). As such, the control system (114) may generate one or more control signals for drilling equipment based on an updated well path design and/or a geological model. In some embodiments, the reservoir simulator (160) determines one or more formation top depths from seismic data and/or well log data. The reservoir simulator (160) may use these formation top depths to adjust the well path of the wellbore (104) accordingly.

While FIG. 1 shows various configurations of components, other configurations may be used without departing from the scope of the disclosure. For example, various components in FIG. 1 may be combined to create a single component. As another example, the functionality performed by a single component may be performed by two or more components.

Figure 2:
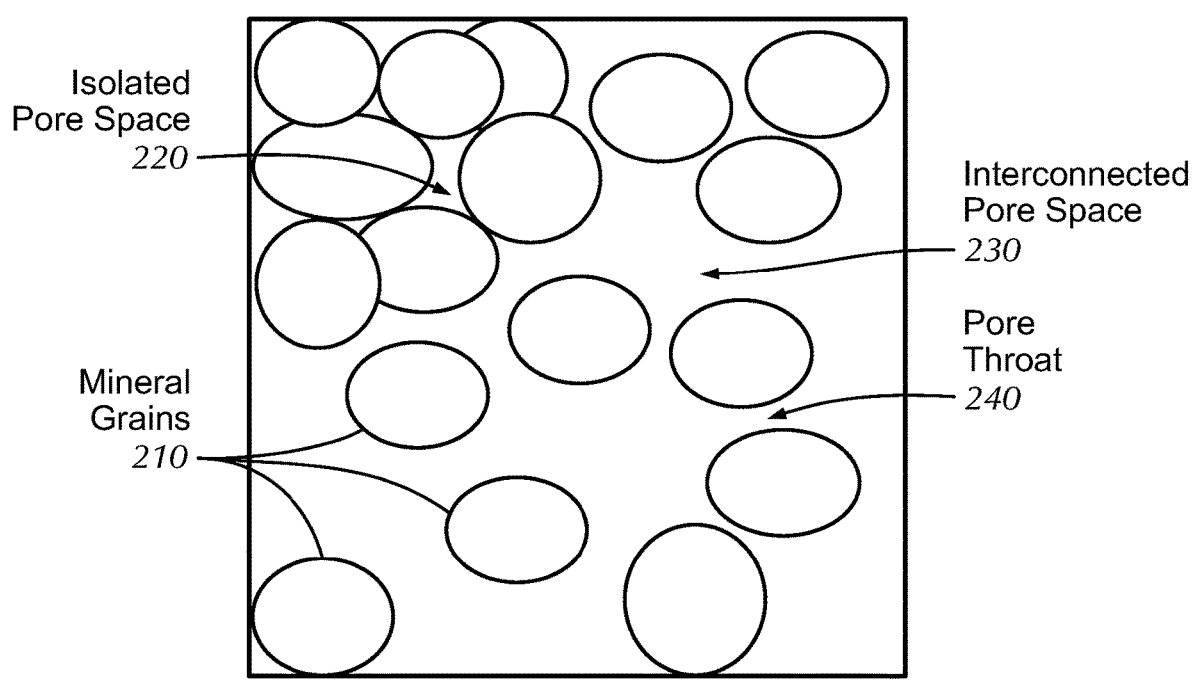
FIG. 2 shows an example in accordance with one or more embodiments.

FIG. 2 shows an example of total porosity for a rock sample. Total porosity is associated with the total pore space which is the sum of isolated pore space (220) and interconnected pore space (230) in the rock bulk volume of mineral grains (210). In particular, isolated porosity is the percentage of isolated pore space (220) with respect to the bulk volume. Effective porosity is the percentage of interconnected pore space (230) with respect to the bulk volume. For example, determining effective porosity requires fluid flow to determine if pores are interconnected. At a given height above the free-water level, a capillary water becomes "irreducible". This capillary water and clay bound water (e.g., isolated porosity) forms the irreducible water saturation (Swi) with respect to effective porosity.

Figure 3:
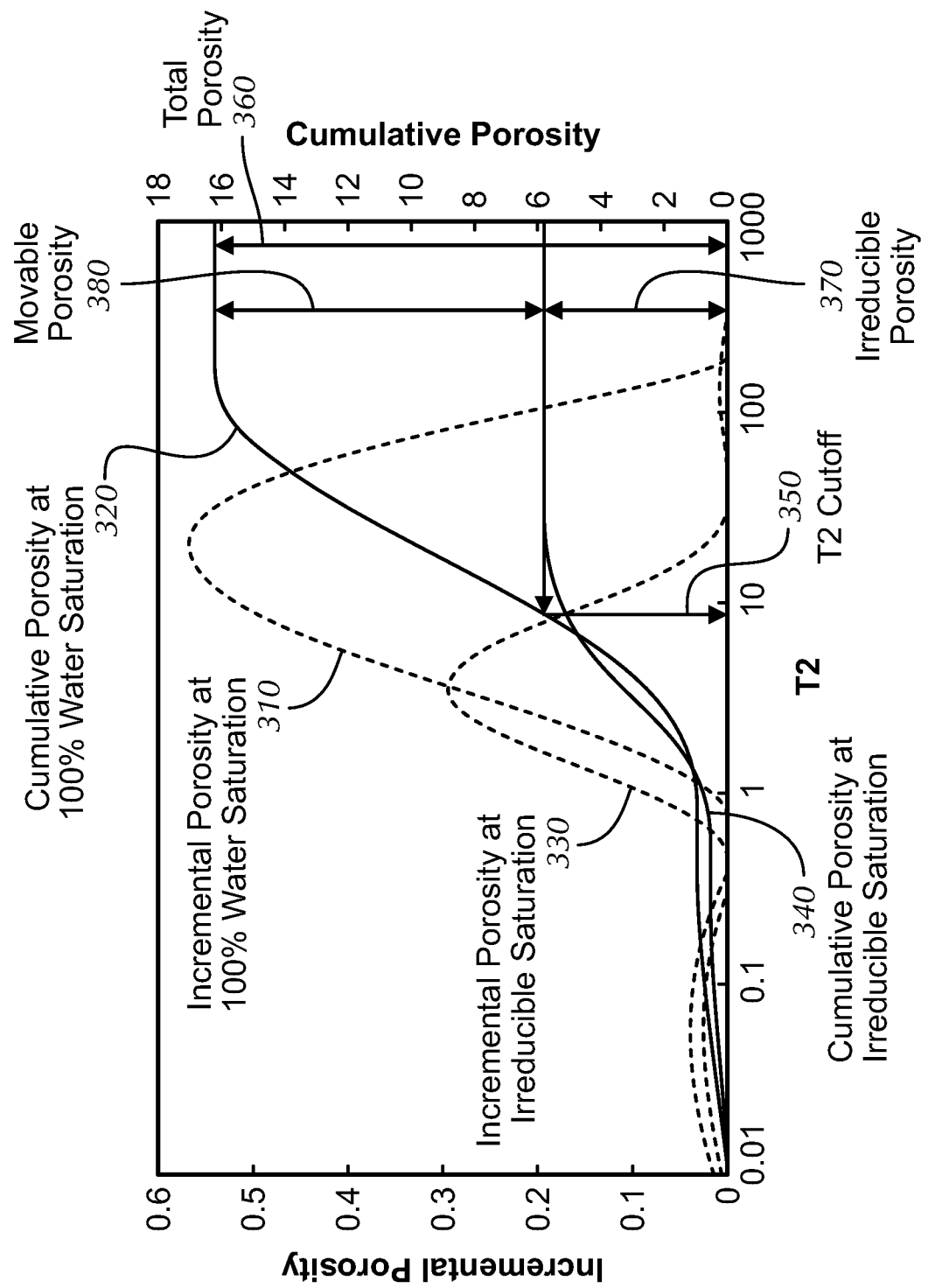
FIG. 3 shows an example in accordance with one or more embodiments.

FIG. 3 shows an example of NMR $T_2$ distribution for a rock sample at 100% water saturation and at irreducible saturation after centrifuge spinning. The NMR $T_2$ distribution includes incremental porosity at 100% water saturation (310), cumulative porosity at 100% water saturation (320), incremental porosity at irreducible saturation (330), and cumulative porosity at irreducible saturation (340) for the rock sample. In particular, the cumulative porosity (320, 340) may be determined from an integration of the incremental porosity (310, 330). The NMR $T_{2c}$ value (350) is determined by measuring an NMR $T_2$ value of a cumulative porosity for the rock sample at 100% water saturation (320) at the cross point of a maximum cumulative porosity for the rock sample at irreducible saturation (340). Because NMR $T_2$ distribution data reflect pore size distribution of the rock sample, total porosity (360), irreducible porosity (370), and movable porosity (380) may be measured from the NMR $T_2$ distribution data. Irreducible porosity is associated with capillary bound water with an NMR $T_2$ value smaller than NMR $T_{2c}$. Likewise, movable porosity is associated with movable water with an NMR $T_2$ value larger than NMR $T_{2c}$.

Figure 4:
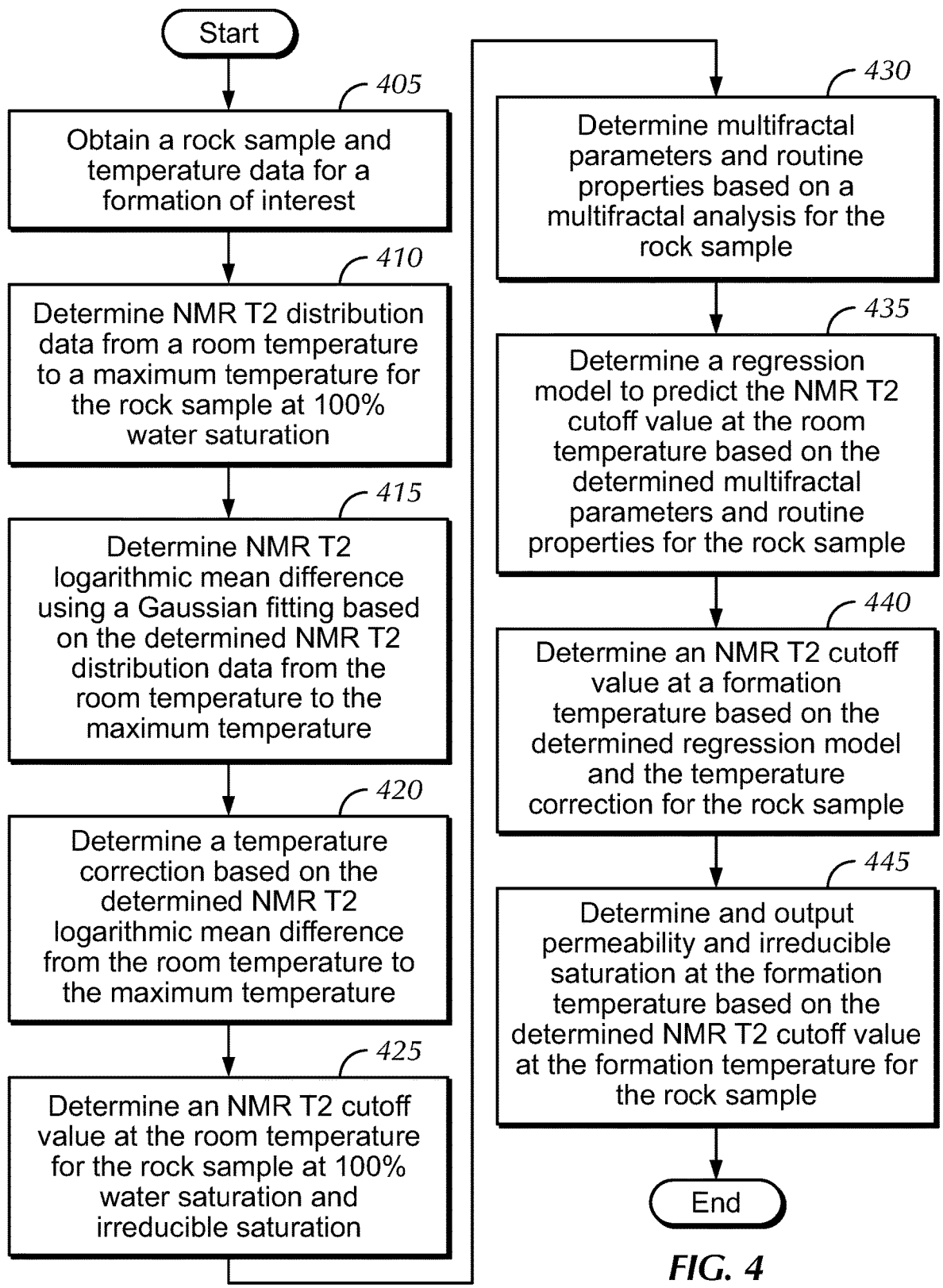
FIG. 4 shows a flowchart in accordance with one or more embodiments.

FIG. 4 shows a flowchart in accordance with one or more embodiments. Specifically, FIG. 4 describes a general workflow to determine the temperature correct NMR $T_{2c}$ value at a formation temperature for a targeted formation of interest based on well logs. One or more blocks in FIG. 4 may be performed by one or more components (e.g., logging system (110), reservoir simulator (160), and control system (114)) as described in FIG. 1. While the various blocks in FIG. 4 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

Initially, in Block 405, a rock sample and temperature data are obtained for a formation of interest in accordance with one or more embodiments. For example, temperature data may be measured in the laboratory or in a temperature log. As another example, the rock sample may be obtained when drilling a well (102) through a targeted formation (106) of interest by the control system (114).

In Block 410, NMR $T_2$ distribution data are determined from a room temperature to a maximum temperature for the rock sample at 100% water saturation in accordance with one or more embodiments. The NMR $T_2$ distribution data may include incremental porosity and cumulative porosity. The maximum temperature is determined by the maximum temperature of a temperature control system. The temperature range and a temperature step in Celsius (° C.) or Fahrenheit (° F.) may be determined by a user based on prior experience. For example, NMR $T_2$ distribution data of incremental porosity are determined for a temperature range from 10° C. to 100° C. with a temperature step of 10° C. As another example, a temperature step may be chosen from a range from 10° C. to 20° C. In particular, the reservoir simulator may remove a rock sample from the analysis when the NMR $T_2$ distribution data of the rock sample show significant diffusion coupling effect.

In Block 415, NMR $T_2$ logarithmic mean difference is determined using a Gaussian fitting based on the determined NMR $T_2$ distribution data from a room temperature to a maximum temperature in accordance with one or more embodiments. The reservoir simulator may applies a Gaussian fitting to determine a fitting curve to match the NMR $T_2$ distribution for meso pores of the rock sample. Thus, the overall shift of the NMR $T_2$ distribution from a low temperature to a high temperature may be evaluated by comparing their NMR $T_2$ lm mean difference based on a Gaussian distribution.

In Block 420, a temperature correction is determined based on the determined NMR $T_2$ logarithmic mean difference from the room temperature to the maximum temperature in accordance with one or more embodiments. For example, the reservoir simulator may apply a linear fitting to determine the temperature correction by matching the overall relaxation time change with temperature (e.g., see the accompanying description to FIG. 5). As another example, the linear fitting may be applied to extrapolate the overall relaxation time change for a formation temperature out of the laboratory temperature range.

In Block 425, an NMR $T_{2c}$ value is determined at the room temperature for the rock sample at 100% water saturation and irreducible saturation in accordance with one or more embodiments. The NMR $T_{2c}$ value is determined by measuring an NMR $T_2$ value of a cumulative porosity for the rock sample at 100% water saturation at the cross point of a maximum cumulative porosity for the rock sample at irreducible saturation (e.g., see the accompanying description to FIG. 3).

Continuing with FIG. 4, in Block 430, multifractal parameters and routine properties are determined based on a multifractal dimension analysis for the rock sample in accordance with one or more embodiments. For example, the reservoir simulator may apply a fractal analysis on the NMR $T_2$ distribution data to measure fractal dimensions ($D_{min}$, $D_{max}$) based on a capillary bundle tube model and a basic power-law relationship of a fractal structure. As another example, the reservoir simulator may apply the multifractal dimension analysis and a dyadic scaling down algorithm to determine mass exponents, singularity spectrum, multifractal spectrum, probability function, and generalized dimension for a range of moment order (e.g., a range from −10 to 10).

In Block 435, a regression model is determined to predict the NMR $T_{2c}$ value at the room temperature based on the determined multifractal parameters and routine properties for the rock sample in accordance with one or more embodiments. For example, the reservoir simulator may apply a linear regression algorithm to determine a model to predict the NMR $T_{2c}$ value at the room temperature based on $D_{min}$, $D_{max}$, and FZI (Equation 9). As another example, the reservoir simulator may combine multifractal parameters with routine parameters (e.g., FZI) when to determine the regression model (Equation 11).

In Block 440, the NMR $T_{2c}$ value is determined at a formation temperature based on the determined regression model and the temperature correction in accordance with one or more embodiments. For example, the reservoir simulator may combine the regression model (Equation 11) and the temperature correction (Equation 13) to predict a temperature correct NMR $T_{2c}$ value at a formation temperature (Equation 14) for the rock sample.

In Block 445, permeability and irreducible saturation are determined at the formation temperature based on the determined NMR $T_{2c}$ value at the formation temperature for the rock sample in accordance with one or more embodiments. For example, the reservoir simulator may determine FFI and BVI based on the temperature correct NMR $T_{2c}$ value for the formation temperature for the rock sample (e.g., see the accompanying description to FIG. 3). As another example, the reservoir simulator may determine permeability at the formation temperature for the rock sample based on BVI and FFI using a free fluid model based on the Timur-Coates equation (Equation 15).

Figure 5A:
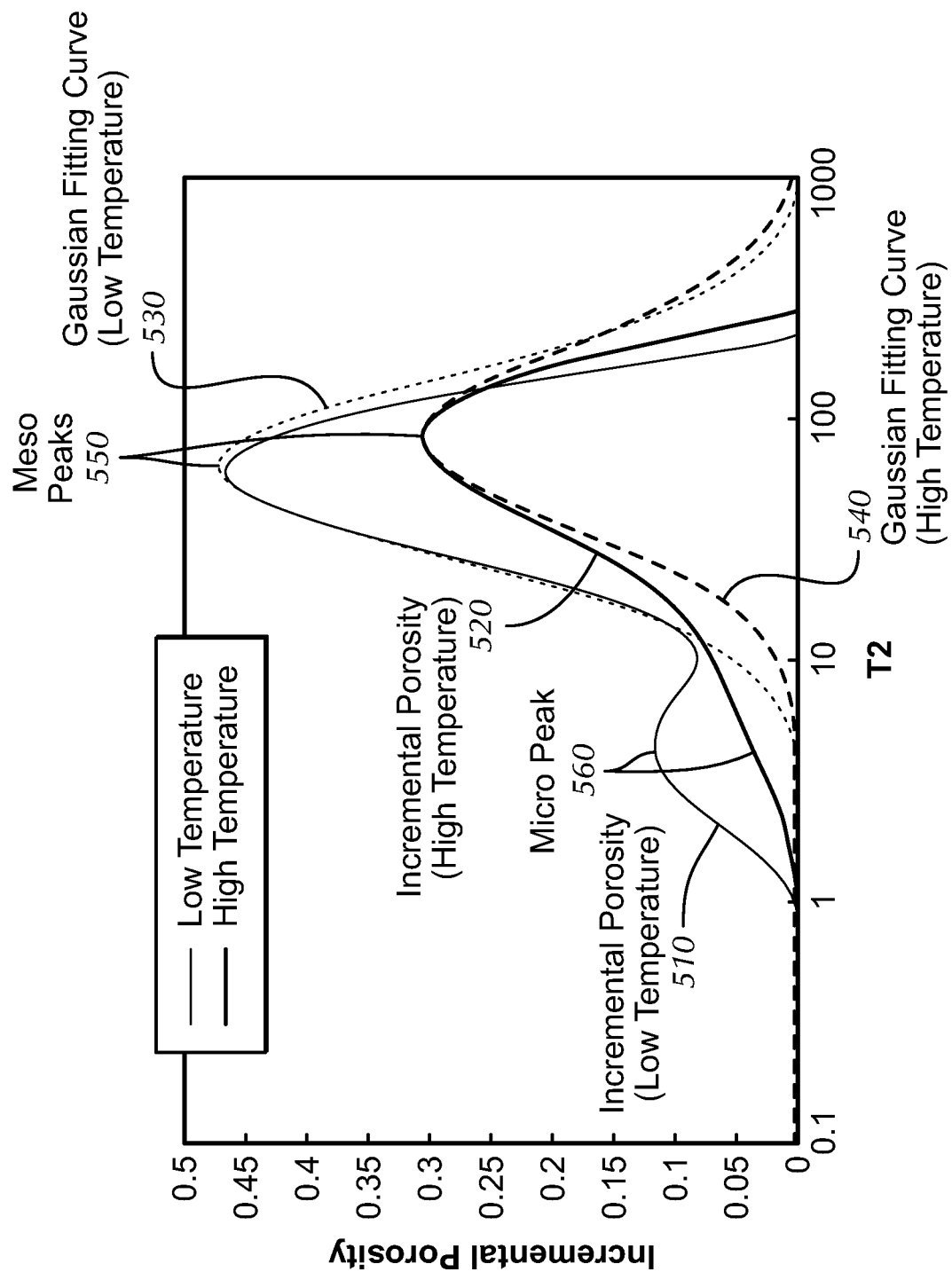
FIGS. 5A and 5B show examples in accordance with one or more embodiments.
Figure 5B:
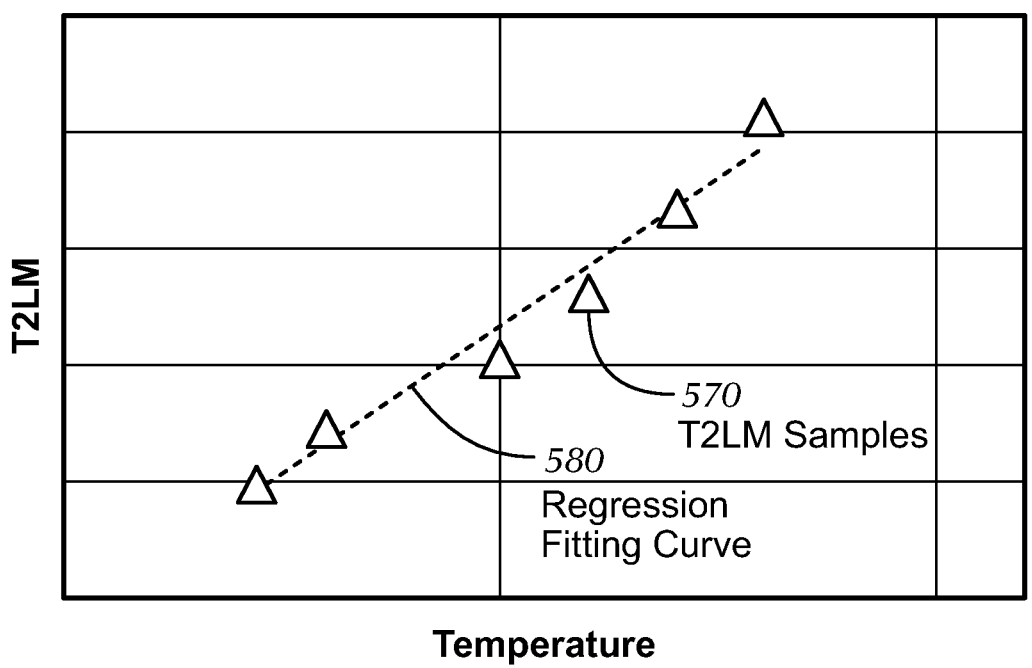

FIGS. 5A and 5B provide examples of a temperature correction of NMR $T_2$ distribution based on the temperature dependence of NMR $T_2$ logarithmic mean difference. FIG. 5A shows an incremental porosity at low temperature (510) and an incremental porosity at high temperature (520) from the NMR $T_2$ distribution for the rock sample. The reservoir simulator applies a Gaussian fitting to match meso peaks (550) of the incremental porosity at the high or low temperature with a Gaussian fitting curve (530, 540). For example, a first Gaussian fitting curve with a position $\mu_{low}$ is determined by matching meso peaks of the $T_2$ distribution at a low temperature. Likewise, a second Gaussian fitting curve with a position $\mu_{high}$ is determined by matching meso peaks of the $T_2$ distribution at a high temperature. As another example, the $T_2$ logarithmic mean difference is determined by a logarithmic mean difference of $\mu_{low}$ and $\mu_{high}$. Further analysis by a Gaussian fitting may reveal if mesa pore and micro pore NMR $T_2$ distributions have the same degree of temperature dependence affected by diffusion and different surface properties. The ratio of micro peaks (560) and meso peaks (550) at high temperatures is kept the same at low temperatures. FIG. 5B shows an example of a temperature correction of NMR $T_2$ distribution determined a linear regression fitting curve (580) based on the temperature dependence of NMR $T_2$ logarithmic mean difference (570).

Figure 6:
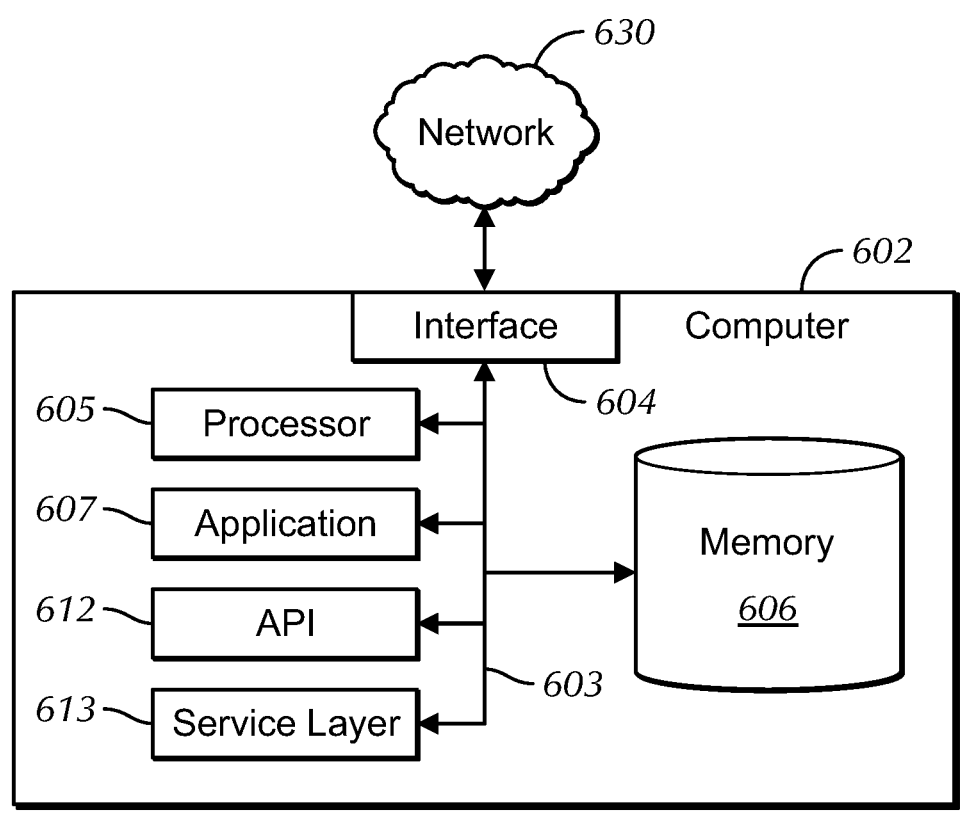
FIG. 6 shows a computer system in accordance with one or more embodiments.

Embodiments disclosed herein may be implemented on any suitable computing device, such as a computer system. FIG. 6 is a block diagram of a computer system used to provide computational functionalities associated with described algorithms, methods, functions, processes, flows, and procedures as described in the instant disclosure, according to an implementation. The illustrated computer (602) is intended to encompass any computing device such as a high performance computing (HPC) device, a server, desktop computer, laptop/notebook computer, wireless data port, smart phone, personal data assistant (PDA), tablet computing device, one or more processors within these devices, or any other suitable processing device, including both physical or virtual instances (or both) of the computing device. Additionally, the computer (602) may include a computer that includes an input device, such as a keypad, keyboard, touch screen, or other device that can accept user information, and an output device that conveys information associated with the operation of the computer (602), including digital data, visual, or audio information (or a combination of information), or a GUI.

The computer (602) can serve in a role as a client, network component, a server, a database or other persistency, or any other component (or a combination of roles) of a computer system for performing the subject matter described in the instant disclosure. The illustrated computer (602) is communicably coupled with a network (630) or cloud. In some implementations, one or more components of the computer (602) may be configured to operate within environments, including cloud-computing-based, local, global, or other environment (or a combination of environments).

At a high level, the computer (602) is an electronic computing device operable to receive, transmit, process, store, or manage data and information associated with the described subject matter. According to some implementations, the computer (602) may also include or be communicably coupled with an application server, e-mail server, web server, caching server, streaming data server, business intelligence (BI) server, or other server (or a combination of servers).

The computer (602) can receive requests over network (630) or cloud from a client application (for example, executing on another computer (602)) and responding to the received requests by processing the said requests in an appropriate software application. In addition, requests may also be sent to the computer (602) from internal users (for example, from a command console or by other appropriate access method), external or third-parties, other automated applications, as well as any other appropriate entities, individuals, systems, or computers.

Each of the components of the computer (602) can communicate using a system bus (603). In some implementations, any or all of the components of the computer (602), both hardware or software (or a combination of hardware and software), may interface with each other or the interface (604) (or a combination of both) over the system bus (603) using an application programming interface (API) (612) or a service layer (613) (or a combination of the API (612) and service layer (613). The API (612) may include specifications for routines, data structures, and object classes. The API (612) may be either computer-language independent or dependent and refer to a complete interface, a single function, or even a set of APIs. The service layer (613) provides software services to the computer (602) or other components (whether or not illustrated) that are communicably coupled to the computer (602). The functionality of the computer (602) may be accessible for all service consumers using this service layer. Software services, such as those provided by the service layer (613), provide reusable, defined business functionalities through a defined interface. For example, the interface may be software written in JAVA, C++, or other suitable language providing data in extensible markup language (XML) format or other suitable format. While illustrated as an integrated component of the computer (602), alternative implementations may illustrate the API (612) or the service layer (613) as stand-alone components in relation to other components of the computer (602) or other components (whether or not illustrated) that are communicably coupled to the computer (602). Moreover, any or all parts of the API (612) or the service layer (613) may be implemented as child or sub-modules of another software module, enterprise application, or hardware module without departing from the scope of this disclosure.

The computer (602) includes an interface (604). Although illustrated as a single interface (604) in FIG. 6, two or more interfaces (604) may be used according to particular needs, desires, or particular implementations of the computer (602). The interface (604) is used by the computer (602) for communicating with other systems in a distributed environment that are connected to the network (630). Generally, the interface (604 includes logic encoded in software or hardware (or a combination of software and hardware) and operable to communicate with the network (630) or cloud. More specifically, the interface (604) may include software supporting one or more communication protocols associated with communications such that the network (630) or interface's hardware is operable to communicate physical signals within and outside of the illustrated computer (602).

The computer (602) includes at least one computer processor (605). Although illustrated as a single computer processor (605) in FIG. 6, two or more processors may be used according to particular needs, desires, or particular implementations of the computer (602). Generally, the computer processor (605) executes instructions and manipulates data to perform the operations of the computer (602) and any algorithms, methods, functions, processes, flows, and procedures as described in the instant disclosure.

The computer (602) also includes a memory (606) that holds data for the computer (602) or other components (or a combination of both) that can be connected to the network (630). For example, memory (606) can be a database storing data consistent with this disclosure. Although illustrated as a single memory (606) in FIG. 6, two or more memories may be used according to particular needs, desires, or particular implementations of the computer (602) and the described functionality. While memory (606) is illustrated as an integral component of the computer (602), in alternative implementations, memory (606) can be external to the computer (602).

Memory (606) can be a computer-readable recording medium and may be composed of, for example, at least one of a ROM (Read Only Memory), an EPROM (Erasable Programmable ROM), an EEPROM (Electrically Erasable Programmable ROM), and a RAM (Random Access Memory). Memory (606) may be called a register, a cache, a main memory (main storage apparatus), or the like. Memory (606) can save a program (program code), a software module, and the like that can be executed to carry out the radio communication method according to an embodiment of the present invention.

The application (607) is an algorithmic software engine providing functionality according to particular needs, desires, or particular implementations of the computer (602), particularly with respect to functionality described in this disclosure. For example, application (607) can serve as one or more components, modules, applications, etc. Further, although illustrated as a single application (607), the application (607) may be implemented as multiple applications (607) on the computer (602). In addition, although illustrated as integral to the computer (602), in alternative implementations, the application (607) can be external to the computer (602).

There may be any number of computers (602) associated with, or external to, a computer system containing computer (602), each computer (602) communicating over network (630). Further, the term "client," "user," and other appropriate terminology may be used interchangeably as appropriate without departing from the scope of this disclosure. Moreover, this disclosure contemplates that many users may use one computer (602), or that one user may use multiple computers (602).

In some embodiments, the computer (602) is implemented as part of a cloud computing system. For example, a cloud computing system may include one or more remote servers along with various other cloud components, such as cloud storage units and edge servers. In particular, a cloud computing system may perform one or more computing operations without direct active management by a user device or local computer system. As such, a cloud computing system may have different functions distributed over multiple locations from a central server, which may be performed using one or more Internet connections. More specifically, a cloud computing system may operate according to one or more service models, such as infrastructure as a service (IaaS), platform as a service (PaaS), software as a service (SaaS), mobile "backend" as a service (MBaaS), artificial intelligence as a service (AIaaS), serverless computing, and/or function as a service (FaaS).

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

While the disclosure has been described with respect to a limited number of embodiments, those skilled in the art, having benefit of this disclosure, will appreciate that other embodiments can be devised which do not depart from the scope of the disclosure as disclosed herein. Accordingly, the scope of the disclosure should be limited only by the attached claims.

What is claimed is:

1. A nuclear magnetic resonance (NMR) logging method, comprising:
    obtaining an NMR well log and a measured downhole temperature for a formation in a subsurface region;
    obtaining at least one rock sample of the formation from the subsurface region;
    determining an NMR distribution for each rock sample at a plurality of temperatures;
    selecting a set of rock samples based on the NMR distribution of the rock sample;
    for each selected rock sample, using a computer;
        determining a first parameter of the NMR distribution at each of a plurality of laboratory measured temperatures;
        determining a regression parameter of a relationship between the first parameter of the NMR distribution and laboratory measured temperatures;
        determining a first fractal parameter and a second fractal parameter of the NMR distribution; and
        determining a second parameter of the NMR distribution based, at least in part, on the first fractal parameter, the second fractal parameter, the regression parameter, and the downhole temperature measurement; and
    determining a parameter of the formation based, at least in part, on the second parameter of the NMR distributions of the set of rock samples.

2. The method of claim 1, wherein the NMR distribution for each rock sample is NMR transverse relaxation time ($T_2$) distribution.

3. The method of claim 1, wherein the selected set of rock samples excludes the rock samples with $T_2$ distribution exhibiting effects of significant diffusion coupling when meso and micro peaks in the $T_2$ distribution converge into one peak.

4. The method of claim 1, wherein the first parameter of the $T_2$ distribution is a $T_2$ logarithmic mean difference for the rock sample at 100% water saturation.

5. The method of claim 4, wherein a first Gaussian fitting curve with a position $\mu_{low}$ is determined by matching meso peaks of the $T_2$ distribution at a low temperature.

6. The method of claim 4, wherein a second Gaussian fitting curve with a position $\mu_{high}$ is determined by matching meso peaks of the $T_2$ distribution at a high temperature.

7. The method of claim 4, wherein the $T_2$ logarithmic mean difference is determined by a logarithmic mean difference of $\mu_{low}$ and $\mu_{high}$.

8. The method of claim 1, wherein the regression parameter is determined using a log linear regression relationship between the first parameter of the NMR distribution and laboratory measured temperature.

9. The method of claim 1, wherein the first fractal parameter of the NMR distribution is minimal fractal dimension $D_{min}$ determined based on a multifractal analysis, and the second fractal parameter of the NMR distribution is maximal fractal dimension $D_{max}$ based on a multifractal analysis.

10. The method of claim 1, wherein the second parameter of the NMR distribution is a $T_2$-cutoff value ($T_{2c}$) at the measured downhole temperature.

11. The method of claim 10, wherein the $T_2$-cutoff value ($T_{2c}$) is determined by measuring a $T_2$ value of a cumulative porosity for the rock sample at 100% water saturation at a crossing-point of a cumulative porosity for the rock sample at irreducible saturation.

12. The method of claim 1, wherein the parameter of the formation is a permeability or an irreducible saturation.

13. The method of claim 1, wherein determining the parameter of the formation is performed using a Timur-Coates equation.

14. A non-transitory computer readable medium storing instructions executable by a computer processor, the instructions comprising functionality for:
    obtaining an NMR well log and a measured downhole temperature for a formation in a subsurface region;
    obtaining at least one rock sample of the formation from the subsurface region;
    determining an NMR distribution for each rock sample at a plurality of temperatures;
    selecting a set of rock samples based on the NMR distribution of the rock sample;
    for each selected rock sample, using a computer;

determining a first parameter of the NMR distribution at each of a plurality of laboratory measured temperatures;

determining a regression parameter of a relationship between the first parameter of the NMR distribution and laboratory measured temperatures;

determining a first fractal parameter and a second fractal parameter of the NMR distribution; and determining a second parameter of the NMR distribution based, at least in part, on the first fractal parameter, the second fractal parameter, the regression parameter, and the downhole temperature measurement; and determining a parameter of the formation based, at least in part, on the second parameter of the NMR distributions of the set of rock samples.

15. The non-transitory computer readable medium of claim 14, wherein the NMR distribution for each rock sample is NMR transverse relaxation time ($T_2$) distribution, wherein the selected set of rock samples excludes the rock samples with $T_2$ distribution exhibiting effects of significant diffusion coupling when meso and micro peaks in the $T_2$ distribution converge into one peak, and wherein the first parameter of the $T_2$ distribution is a $T_2$ logarithmic mean difference for the rock sample at 100% water saturation.

16. The non-transitory computer readable medium of claim 15, wherein a first Gaussian fitting curve with a position $\mu_{low}$ is determined by matching meso peaks of the $T_2$ distribution at a low temperature, wherein a second Gaussian fitting curve with a position $\mu_{high}$ is determined by matching meso peaks of the $T_2$ distribution at a high temperature, and wherein the $T_2$ logarithmic mean difference is determined by a logarithmic mean difference of $\mu_{low}$ and $\mu_{high}$.

17. The non-transitory computer readable medium of claim 14, wherein the regression parameter is determined using a log linear regression relationship between the first parameter of the NMR distribution and laboratory measured temperature, and wherein the first fractal parameter of the NMR distribution is minimal fractal dimension $D_{min}$ determined based on a multifractal analysis, and the second fractal parameter of the NMR distribution is maximal fractal dimension $D_{max}$ based on a multifractal analysis.

18. The non-transitory computer readable medium of claim 14, wherein the second parameter of the NMR distribution is a $T_2$ cutoff value ($T_{2c}$) at the measured downhole temperature, and wherein the $T_2$-cutoff value ($T_{2c}$) is determined by measuring a $T_2$ value of a cumulative porosity for the rock sample at 100% water saturation at a crossing-point of a cumulative porosity for the rock sample at irreducible saturation.

19. The non-transitory computer readable medium of claim 14, wherein the parameter of the formation is a permeability or an irreducible saturation, and wherein determining the parameter of the formation is performed using a Timur-Coates equation.

20. A system, comprising:

a logging system coupled to a logging tool;

a well system coupled to the logging system and a wellbore; and a reservoir simulator module comprising a computer processor, wherein the reservoir simulator module is coupled to the logging system and the well system, the reservoir simulator module comprising functionality for:

obtaining an NMR well log and a measured downhole temperature for a formation in a subsurface region;

obtaining at least one rock sample of the formation from the subsurface region;

determining an NMR distribution for each rock sample at a plurality of temperatures;

selecting a set of rock samples based on the NMR distribution of the rock sample;

for each selected rock sample, using a computer;

determining a first parameter of the NMR distribution at each of a plurality of laboratory measured temperatures;

determining a regression parameter of a relationship between the first parameter of the NMR distribution and laboratory measured temperatures;

determining a first fractal parameter and a second fractal parameter of the NMR distribution; and determining a second parameter of the NMR distribution based, at least in part, on the first fractal parameter, the second fractal parameter, the regression parameter, and the downhole temperature measurement; and determining a parameter of the formation based, at least in part, on the second parameter of the NMR distributions of the set of rock samples.

* * * * *